(12) United States Patent
Sun

(10) Patent No.: US 12,259,648 B2
(45) Date of Patent: Mar. 25, 2025

(54) PHOTOMASK PROTECTION DEVICE, PHOTOMASK PROTECTION SYSTEM, AND USE METHOD OF PHOTOMASK PROTECTION SYSTEM

(71) Applicant: CHANGXIN MEMORY TECHNOLOGIES, INC., Hefei (CN)

(72) Inventor: Fei Sun, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 557 days.

(21) Appl. No.: 17/668,630

(22) Filed: Feb. 10, 2022

(65) Prior Publication Data

US 2022/0269164 A1 Aug. 25, 2022

Related U.S. Application Data

(63) Continuation of application No. PCT/CN2021/110972, filed on Aug. 5, 2021.

(30) Foreign Application Priority Data

Jan. 4, 2021 (CN) .......................... 202110003761.2

(51) Int. Cl.
  *G03F 1/64* (2012.01)
  *G03F 1/62* (2012.01)

(52) U.S. Cl.
  CPC . *G03F 1/64* (2013.01); *G03F 1/62* (2013.01)

(58) Field of Classification Search
  CPC ..................................... G03F 1/62; G03F 1/64
  USPC ............................................................. 430/5
  See application file for complete search history.

(56) References Cited

U.S. PATENT DOCUMENTS

| | | | |
|---|---|---|---|
| 6,713,200 B2 | 3/2004 | Arishima | |
| 7,829,248 B2 | 11/2010 | Lin | |
| 10,353,283 B2 | 7/2019 | Yanase et al. | |
| 10,571,800 B2 * | 2/2020 | Brouns | G03F 7/70983 |
| 2002/0007907 A1 | 1/2002 | Arishima | |
| 2009/0029268 A1 | 1/2009 | Lin | |
| 2018/0011397 A1 | 1/2018 | Yanase et al. | |

FOREIGN PATENT DOCUMENTS

| | | |
|---|---|---|
| CN | 101354527 A | 1/2009 |
| CN | 101354527 B | 8/2013 |
| CN | 112707016 A | 4/2021 |
| JP | H08114911 A | 5/1996 |
| JP | 2017083791 A | 5/2017 |
| TW | 463073 B | 11/2001 |

\* cited by examiner

*Primary Examiner* — Christopher G Young
(74) *Attorney, Agent, or Firm* — Kilpatrick Townsend & Stockton LLP

(57) ABSTRACT

A photomask protection device, a photomask protection system, and a use method of a photomask protection system are provided. The photomask protection device includes a frame and a pellicle. The frame is disposed on a substrate of a photomask and is provided with a clamping space. Edges of the pellicle are fixed in the clamping space.

10 Claims, 11 Drawing Sheets

PHOTOMASK PROTECTION DEVICE, PHOTOMASK PROTECTION SYSTEM, AND USE METHOD OF PHOTOMASK PROTECTION SYSTEM

CROSS-REFERENCE TO RELATED APPLICATION

This is a continuation application of International Patent Application No. PCT/CN2021/110972, filed on Aug. 5, 2021, which claims priority to Chinese patent application No. 202110003761.2, filed on Jan. 4, 2021, entitled "Photomask Protection Device and Photomask Protection System". The disclosures of International Patent Application No. PCT/CN2021/110972 and Chinese patent application No. 202110003761.2 are incorporated by reference herein in their entireties.

TECHNICAL FIELD

The disclosure relates to the technical field of semiconductors, and in particular to a photomask protection device, a photomask protection system, and a use method of a photomask protection system.

BACKGROUND

A photoetching process is an important process in semiconductor manufacturing, in particular, it is a process for transferring a pattern layer on a photomask onto a substrate. It is generally necessary to mount a protection device on the photomask to prevent the photomask from being polluted by external dust particles. The protection device of the photomask generally includes a frame and a pellicle.

The pellicle in the related technology is directly adhered to a top end of the frame. Since the pellicle and the frame are adhered together through an adhesive, a gap exists between the pellicle and the frame caused by the failure of the adhesive due to factors such as aging. When an air knife sweeps dust particles falling on a surface of the pellicle, the pellicle is easily torn from the gap, so that the pellicle is damaged, and the whole photomask protection system may be damaged and scrapped.

SUMMARY

The disclosure provides a photomask protection device and a photomask protection system.

According to a first aspect of the disclosure, a photomask protection device including a frame and a pellicle is provided.

The frame is disposed on a substrate of a photomask, and is provided with a clamping space.

Edges of the pellicle are fixed in the clamping space.

According to a second aspect of the disclosure, a photomask protection system is provided, including the above photomask protection device and a photomask. The photomask includes a substrate and a pattern layer.

A frame of the photomask protection device is located on the substrate.

The pattern layer is located on the substrate.

According to a third aspect of the disclosure, a use method of a photomask protection system is provided, including the following operations.

A substrate is provided.

A frame provided with a clamping space is mounted on the substrate.

A pellicle is fixed on the frame with edges of the pellicle being located in the clamping space.

The substrate is provided with a pattern layer.

BRIEF DESCRIPTION OF THE DRAWINGS

Various objects, features, and advantages of the disclosure will become more apparent from the following detailed description of preferred implementations of the disclosure when considered in conjunction with the accompanying drawings. The drawings are merely exemplary illustrations of the disclosure and are not necessarily drawn to scale. In the drawings, like reference numerals refer to the same or similar components throughout. In the drawings.

DETAILED DESCRIPTION

Figure 1:
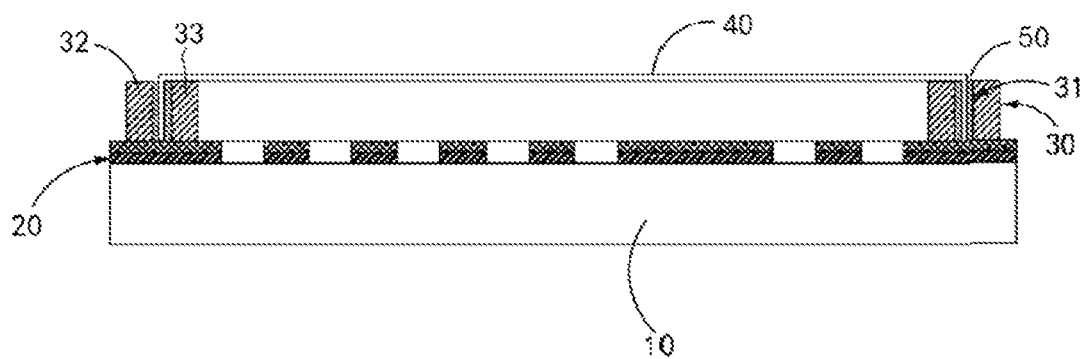
FIG. 1 is a schematic view of a photomask protection system according to a first exemplary embodiment.

Exemplary embodiments that embody the features and advantages of the disclosure will be described in detail in the following description. It will be appreciated that the disclosure may have various changes in different embodiments without departing from the scope of the disclosure, and that the description and drawings are illustrative in nature and are not intended to limit the disclosure.

In the following description of various exemplary implementations of the disclosure, reference is made to the accompanying drawings, which form a part thereof, and in which various exemplary structures, systems, and steps capable of implementing various aspects of the disclosure are shown by way of illustration. It will be appreciated that other specific solutions of components, structures, exemplary devices, systems, and steps may be utilized and structural and functional modifications may be made without departing from the scope of the disclosure. Moreover, although the terms "on", "between", "in", etc. may be used in this specification to describe different exemplary features and elements of the disclosure, these terms are used herein for convenience only, e.g., in accordance with the orientation of the examples in the figures. Nothing in this specification should be construed as requiring a particular three-dimensional orientation of the structure to fall within the scope of the disclosure.

One embodiment of the disclosure provides a photomask protection system that includes a photomask protection device and a photomask, with reference to FIGS. 1-5.

The photomask protection device includes a frame 30 and a pellicle 40.

The photomask includes a substrate 10 and a pattern layer 20.

The frame 30 is disposed on the substrate 10 of the photomask. The frame 30 is provided with a clamping space 31. Edges of the pellicle 40 are fixed in the clamping space 31.

The pattern layer 20 is located on the substrate 10.

According to the photomask protection device of one embodiment of the disclosure, by fixing the edges of the pellicle 40 in the clamping space 31 of the frame 30, a fixing effect of the frame 30 on the pellicle 40 can be improved, and the pellicle 40 is prevented from being separated from the frame 30.

It should be noted that the edges of the pellicle 40 in the present embodiment are clamped in the frame 30, the fixing effect of the frame 30 on the pellicle 40 is better than that of the related technology where the pellicle is directly adhered to a top end of the frame. In the present disclosure, the pellicle 40 is not easily torn even when sweeping dust particles falling on a surface of the pellicle 40.

In some embodiments, all of the edges of the pellicle 40 may be located in the clamping space 31. That is, the clamping space 31 may be arranged around a circumferential perimeter of the pellicle 40, thereby ensuring that the pellicle 40 and the frame 30 are reliably fixed to each other.

In some embodiments, a part of the edges of the pellicle 40 may be located in the clamping space 31. That is, a section of the pellicle 40 in a circumferential direction is fixed in the clamping space 31. For example, there are multiple relatively long sections disposed in the circumferential direction of the pellicle 40, the multiple relatively long sections are located in the clamping space 31, and the whole pellicle 40 is fixed to the frame 30 through the multiple relatively long section bodies.

It should be noted that the substrate 10 and the pattern layer 20 form the photomask of the photomask protection device, the photomask may be used for manufacturing semiconductor wafers.

In one embodiment, the substrate 10 may be a defect-free fused silica ($SiO_2$), glass, calcium fluoride, or other suitable materials.

The pattern layer 20 is formed on the substrate 10. Methods of forming the pattern layer 20 on the substrate 10 may include Chemical Vapor Deposition (CVD), Physical Vapor Deposition (PVD), Atomic Layer Deposition (ALD), plating, and/or other suitable methods. The pattern layer 20 may include, in part or in whole, phase-shifting matter formed by attenuating materials or other conductive materials having different thicknesses and/or different optical phase shifts.

The pattern layer 20 formed on the substrate 10 may include matter (or absorber) that may be configured to attenuate and/or provide a phase shift to a radiation beam for manufacturing a semiconductor wafer during the lithographic patterning process.

In one embodiment, the pattern layer 20 includes chromium, or chromium and silicide. In other embodiments, the pattern layer 20 may include metal silicide such as molybdenum silicide (MoSi) or tantalum silicide ($TaSi_2$), metal nitride, iron oxide, inorganic materials such as molybdenum (Mo), niobium oxide ($Nb_2O_5$), titanium (Ti), tantalum (Ta), chromium nitride (CrN), molybdenum trioxide ($MoO_3$), molybdenum nitride (MoN), chromium oxide ($Cr_2O_3$), titanium nitride (TiN), zirconium nitride (ZrN), titanium oxide ($TiO_2$), tantalum nitride (TaN), tantalum oxide ($Ta_2O_5$), silicon dioxide ($SiO_2$), niobium nitride (NbN), silicon nitride ($Si_3N_4$), neutral aluminum oxide ($Al_2O_3N$), aluminum oxide ($Al_2O_3R$), or other materials or combinations thereof.

In one embodiment, the pellicle 40 is disposed opposite to the pattern layer 20. The pellicle 40 is a thin film permeable to the radiation beam of the lithographic patterning process. The pellicle 40 is adjacent to a patterned side of the substrate 10 so that the pattern layer 20 is located between the pellicle 40 and the substrate 10.

In one embodiment, the frame 30 is configured to attach and fix the pellicle 40. The frame 30 includes a material having certain mechanical strength, and the shape, size and structure of the frame 30 may be designed to properly fix the pellicle 40. In the present embodiment, the frame 30 may include aluminum (Al).

In one embodiment, the photomask protection device further includes a first adhesive layer 50. The first adhesive layer 50 is filled in the clamping space 31. The pellicle 40 is connected to the frame 30 through the first adhesive layer 50.

Specifically, the first adhesive layer 50 is configured to adhere the pellicle 40 to the frame 30. Considering that the edges of the pellicle 40 are located in the clamping space 31, the pellicle 40 and the frame 30 are adhered together by the first adhesive layer 50 between the pellicle 40 and the frame 30.

In one embodiment, the clamping space 31 includes a first side wall 311 and a second side wall 312. The edges of the pellicle 40 are located between the first side wall 311 and the second side wall 312. A gap is formed between at least one of the first side wall 311 or the second side wall 312 and the pellicle 40. The first adhesive layer 50 is filled in the gap, thereby adhering the pellicle 40 and the frame 30 together.

Figure 5:
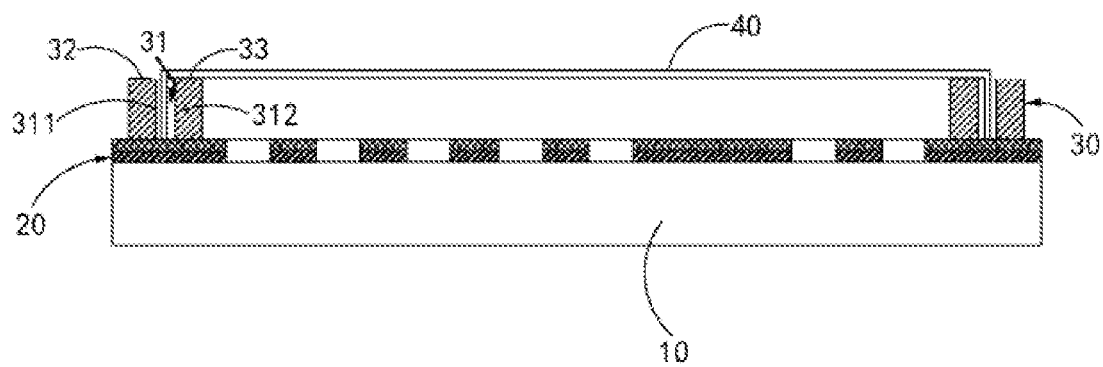
FIG. 5 is a partial schematic view of a photomask protection system according to a first exemplary embodiment.

Specifically, as shown in FIG. 5, the first side wall 311 and the second side wall 312 are disposed opposite to each other to form the clamping space 31 between the first side wall 311 and the second side wall 312. The pellicle 40 is located in the clamping space 31 and there is a gap between the pellicle and each of the first side wall 311 and the second side wall 312. The first adhesive layer 50 is filled in the two gaps, as shown in FIG. 1.

In some embodiments, the pellicle 40 may be in contact with to the first side wall 311, and the first adhesive layer 50 is filled between the pellicle 40 and the second side wall 312. Alternatively, the pellicle 40 may be in contact with to the second side wall 312, and the first adhesive layer 50 is filled between the pellicle 40 and the first side wall 311.

In some embodiments, the pellicle 40 may be directly clamped between the first side wall 311 and the second side wall 312, i.e., the first adhesive layer 50 is omitted.

In one embodiment, as shown in FIGS. 1-4, the photomask protection system further includes a second adhesive layer. The second adhesive layer is located on the substrate 10. The frame 30 is connected to the substrate 10 through the second adhesive layer.

The material of the second adhesive layer may correspond to the first adhesive layer 50, i.e. a substance for adhesion in the related technology. Alternatively, the second adhesive layer may be a self-adhesive shock absorber. The shock absorber may be configured to relieve pressure exerted on the substrate 10 when assembling the photomask protection system or pressure exerted by other pressure sources. The pressure generated by the assembly or other factors is transferred to the substrate 10 through the shock absorber, to reduce or eliminate the pressure.

In some embodiments, the shock absorber may be a soft padding feature. In other embodiments, the shock absorber may include a polymer material, a sponge-liked material, a foam material, or combinations thereof.

In one embodiment, the clamping space 31 is an accommodation groove having a groove bottom located in the frame 30, i.e. a groove formed in the frame 30 for accommodating the edges of the pellicle 40.

Figure 2:
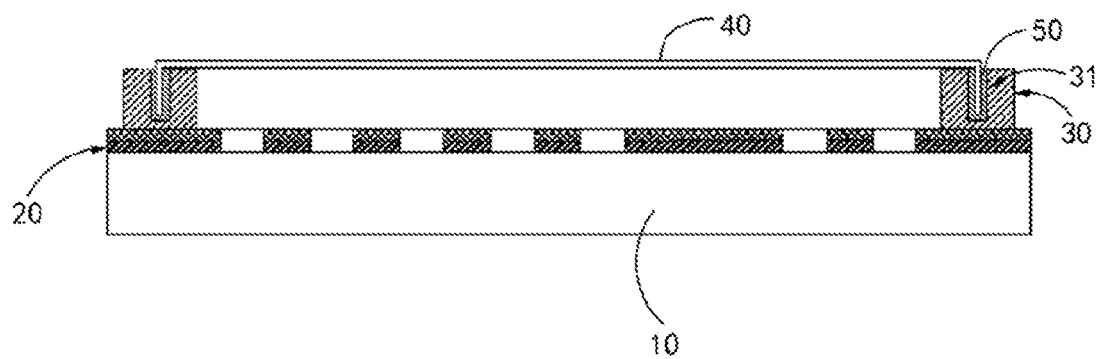
FIG. 2 is a schematic view of a photomask protection system according to a second exemplary embodiment.

In one embodiment, as shown in FIG. 2, the clamping space 31 is an accommodation groove extending in a first direction which is perpendicular to the substrate 10. The edges of the pellicle 40 form a bent section (90-degree bent) which is located in the clamping space 31, and then the middle of the pellicle 40 is disposed opposite to the substrate 10.

Figure 4:
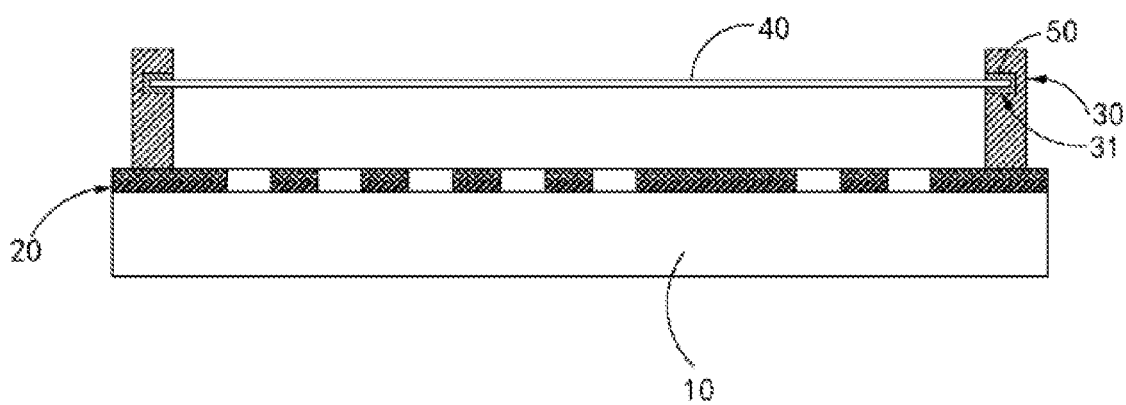
FIG. 4 is a schematic view of a photomask protection system according to a fourth exemplary embodiment.

In one embodiment, as shown in FIG. 4, the clamping space 31 is an accommodation groove extending in a second direction which is parallel to the substrate 10. The whole pellicle 40 is in form of a planar structure. The edges of the pellicle 40 are located in the clamping space 31, and then the middle of the pellicle 40 is disposed opposite to the substrate 10.

Further, the pellicle 40 located in the clamping space 31 is in connection with the frame 30 by the first adhesive layer 50.

It should be noted that the pellicle 40 may be in contact with the groove bottom of the accommodation groove, or the pellicle 40 may be separated from the groove bottom of the accommodation groove, which is not limited herein. The clamping space 31 may be fully or partially filled with the first adhesive layer 50, which is not limited herein, as long as it is possible to ensure that the pellicle 40 is reliably adhered to the frame 30.

In some embodiments, the accommodation groove may also extend in a third direction inclined with respect to the substrate 10. The specific structure and the extending direction of the accommodation groove are not limited, so long as it is possible to ensure that the edges of the pellicle 40 may be clamped in the clamping space 31, and the whole pellicle 40 is opposite to the pattern layer 20.

In one embodiment, the frame 30 is formed in one piece. That is, the frame 30 is an integrated structure, and the clamping space 31, i.e. the accommodation groove, is provided in the frame 30.

In some embodiments, the frame 30 may be a rectangular frame, and an upper end of the rectangular frame is provided with the accommodation groove. The edges of the pellicle 40 are located in the accommodation groove, so that the pellicle 40 is reliably connected to a top end of the rectangular frame, as shown in FIG. 2. Alternatively, a side of the rectangular frame may be provided with the accommodation groove, and the edges of the pellicle 40 are located in the accommodation groove, so that the pellicle 40 is reliably connected to the middle of the rectangular frame, as shown in FIG. 4.

It should be noted that the frame 30 may also be an annular frame, or other frames in other shape. The shape is not limited herein, and may be selected according to actual requirements.

In one embodiment, the accommodation groove is arranged in a circumferential direction of the frame 30 such that all of the edges of the pellicle 40 are located in the clamping space 31. That is, the clamping space 31 forms a circumferentially closed accommodation space, so that the edges of the pellicle 40 can be reliably enclosed, and the pellicle 40 and the frame 30 can be reliably connected to each other with the aid of the first adhesive layer 50.

In one embodiment, the accommodation groove may include multiple sub-accommodation grooves spaced apart in a circumferential direction of the frame 30, and the edges of the pellicle 40 are partially located in the sub-accommodation grooves. In some embodiments, long sections may be reserved on the pellicle in the circumferential direction of the pellicle 40, the long sections are intended to be located in the sub-accommodation grooves.

In one embodiment, the clamping space 31 is an opening which passing through the frame 30, i.e. an opening passing through both sides of the frame 30, for accommodating the edges of the pellicle 40.

It should be noted that with respect to the accommodation groove which has only one opening, the opening here indicates that the clamping space 31 has two ports.

In one embodiment, as shown in FIG. 1, the opening extends in a first direction which is perpendicular to the substrate 10. The edges of the pellicle 40 form a bent section (90-degree bent, or at other angles) which is located in the clamping space 31, and then the middle of the pellicle 40 can be disposed opposite to the substrate 10.

Figure 3:
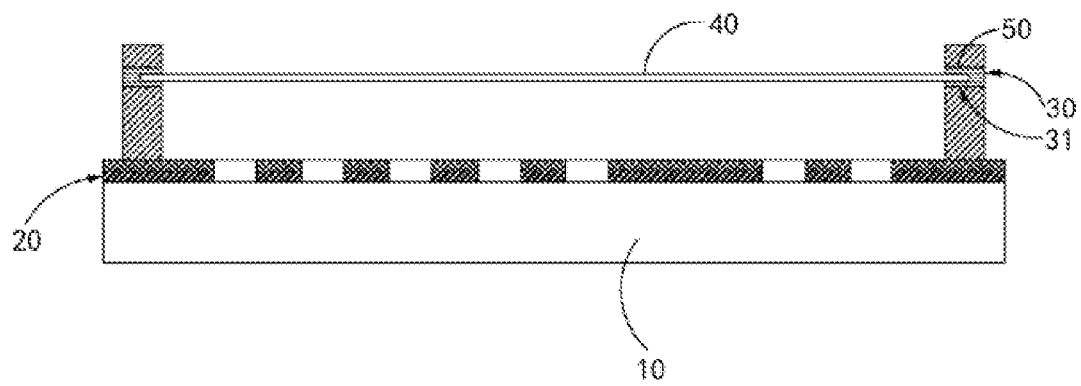
FIG. 3 is a schematic view of a photomask protection system according to a third exemplary embodiment.

In one embodiment, as shown in FIG. 3, the opening extends in a second direction which is parallel to the substrate 10. The whole pellicle 40 is in the form of a planar structure. The edges of the pellicle 40 are located in the clamping space 31, and then the middle of the pellicle 40 can be disposed opposite to the substrate 10.

Further, the pellicle 40 located in the clamping space 31 is in connection with the frame 30 through the first adhesive layer 50.

It should be noted that the length of the pellicle 40 in the opening may correspond to the depth of the opening, or the length of the pellicle 40 in the opening may be less than the depth of the opening, which is not limited herein. The clamping space 31 may be fully or partially filled with the first adhesive layer 50, which is not limited herein, as long as it is possible to ensure that the pellicle 40 is reliably adhered to the frame 30.

In some embodiments, the opening may also extend in a third direction inclined with respective to the substrate 10. The specific structure and the extending direction of the opening are not limited, so long as it is possible to ensure that the edges of the pellicle 40 may be clamped in the clamping space 31, and the whole pellicle 40 is opposite to the pattern layer 20.

In one embodiment, the frame 30 is in the form of a separable structure. That is, the frame 30 is formed by assembling multiple independent components which define the clamping space 31.

In one embodiment, as shown in FIGS. 1 and 5, the frame 30 includes a first section 32 and a second section 33. The first section 32 is located on the substrate 10. The second section 33 is located on the substrate 10. The first section 32 and the second section 33 are spaced apart from each other to form a clamping space 31. That is, the first section 32 and the second section 33 which are independently disposed together form the frame 30. The structure is relatively simple, and the mounting is convenient.

In one embodiment, the first section 32 forms a first rectangular cavity, the second section 33 forms a second rectangular cavity, and the second section 33 is located in the first rectangular cavity. In this way, the first section 32 and the second section 33 forms a nested structure, but are not in contact with each other, thereby forming the clamping space 31, as shown in detail in FIG. 5.

In some embodiments, each of the first section 32 and the second section 33 may be a rectangular frame. An opening is formed between the two rectangular frames, and the edges of the pellicle 40 are located in the opening, so that the pellicle 40 is reliably connected at a top end of the rectangular frame, as shown in FIG. 1.

Alternatively, the two rectangular frames may be stacked in a vertical direction, i.e., the pellicle 40 is clamped between the two rectangular frames stacked in a vertical direction, which is similar to the structure shown in FIG. 3.

It should be noted that the first section 32 and the second section 33 may also be annular frames, or frames in other shape. The shape is not limited herein, and may be selected according to practical requirements.

In one embodiment, the frame 30 is formed in one piece, and the openings are through holes. That is, multiple through holes are formed in the frame 30, and are spaced apart from each other.

Specifically, the through holes may be through holes in a vertical direction, which is similar to the structure shown in FIG. 1. The through holes may also be through holes in a horizontal direction, which is similar to the structure shown in FIG. 3.

In one embodiment, the frame 30 includes a first section 32 and a second section 33. The first section 32 is disposed on the substrate 10, and the first section 32 forms an accommodation cavity. The second section 33 is located in the accommodation cavity and spaced apart from the substrate 10. At least a part of the first section 32 is spaced apart from the second section 33 to form a clamping space 31.

Specifically, the first section 32 of the frame 30 is located on the substrate 10. That is, the first section of the frame 30 is a support structure. The clamping space 31 for clamping the pellicle 40 is formed between the second section 33 and the first section 32, and the pellicle 40 can be fixed by filling the first adhesive layer 50. That is, the second section 33 is supported on the substrate 10 by the first section 32, and the first section 32 is not in direct contact with the substrate 10.

Figure 6:
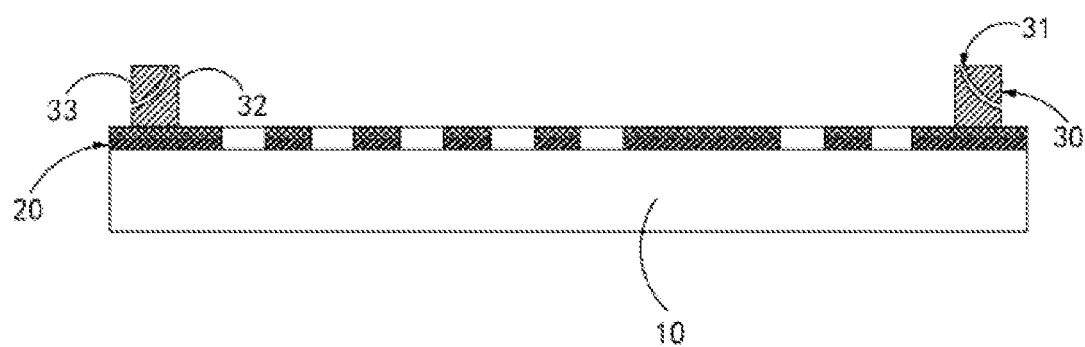
FIG. 6 is a partial schematic view of a photomask protection system according to a fifth exemplary embodiment.

In some embodiments, as shown in FIG. 6, the frame 30 includes a first section 32 and a second section 33. The first section 32 is directly mounted on the substrate 10. The second section 33 is located above the first section 32 to form a clamping space 31 therebetween. In this case, the clamping space 31 is a closed-loop frame extending in a circumferential direction of the frame 30, and the clamping space 31 has an arc shape extending from a top end to a bottom end, as shown in detail in FIG. 6. After the first section 32 is mounted on the substrate 10, the pellicle 40 is placed in place, and then the second section 33 is placed to clamp the pellicle 40.

Figure 7:
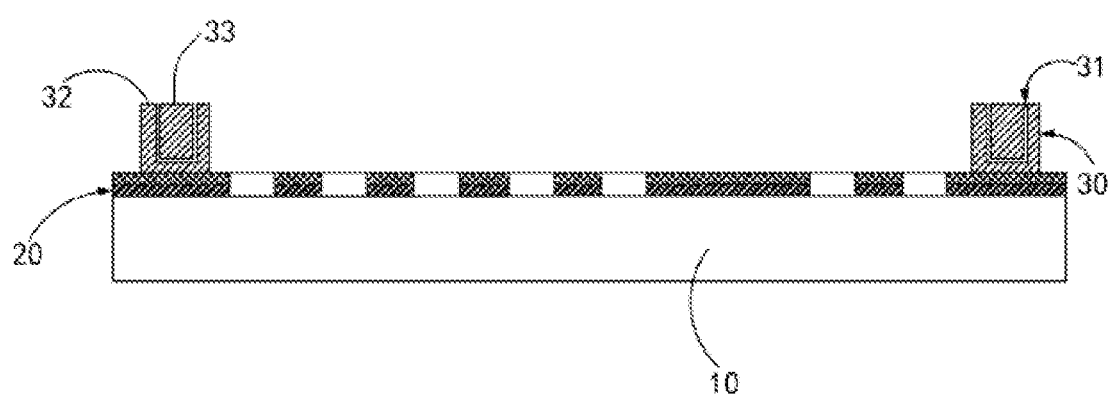
FIG. 7 is a partial schematic view of a photomask protection system according to a sixth exemplary embodiment.

In some embodiments, as shown in FIG. 7, the frame 30 includes a first section 32 and a second section 33. The first section 32 is directly mounted on the substrate 10. The second section 33 is nested in the first section 32. A gap is formed between the first section 32 and both sides of the second section 33 and between the first section 32 and a bottom end of the second section 33, i.e., a clamping space 31 is formed. In this case, a longitudinal cross section of the clamping space 31 is U-shaped, as shown in detail in FIG. 7. Of course, in some embodiments, only one longitudinal gap may be formed between the second section 33 and the second section 33, or only two longitudinal gaps may be formed, or one longitudinal gap and one horizontal gap may be formed. The specific arrangement is not limited herein, and may be adjusted according to actual requirements.

Figure 8:
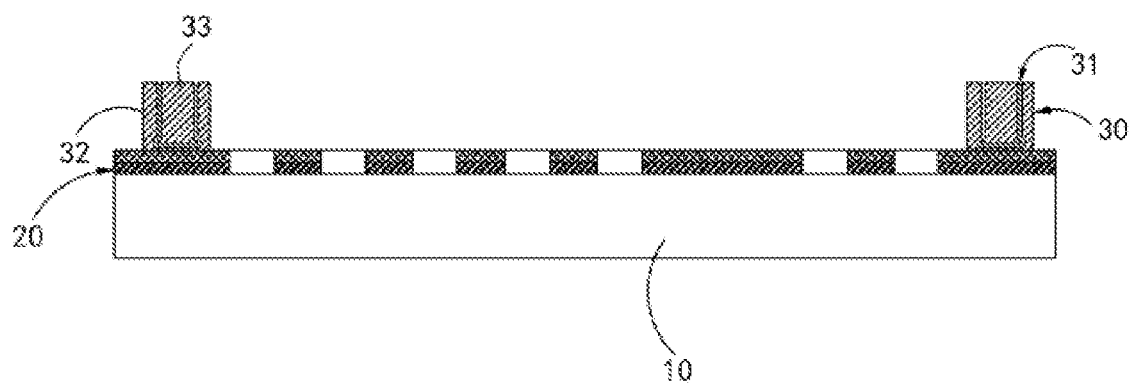
FIG. 8 is a partial schematic view of a photomask protection system according to a seventh exemplary embodiment.

In some embodiments, as shown in FIG. 8, the frame 30 includes a first section 32 and a second section 33. The first section 32 is directly mounted on the substrate 10. The second section 33 is nested in the first section 32. A bottom end of the second section 33 is snap-fitted in the first section 32, and a clamping space 31 is formed between the second section 33 and the first section 32. In order to ensure that the second section 33 is nested in the first section 32, the second section 33 may be provided at the bottom end with a protrusion made of an elastic material to ensure that the bottom end of the second section 33 is snap-fitted in the first section 32.

Figure 9:
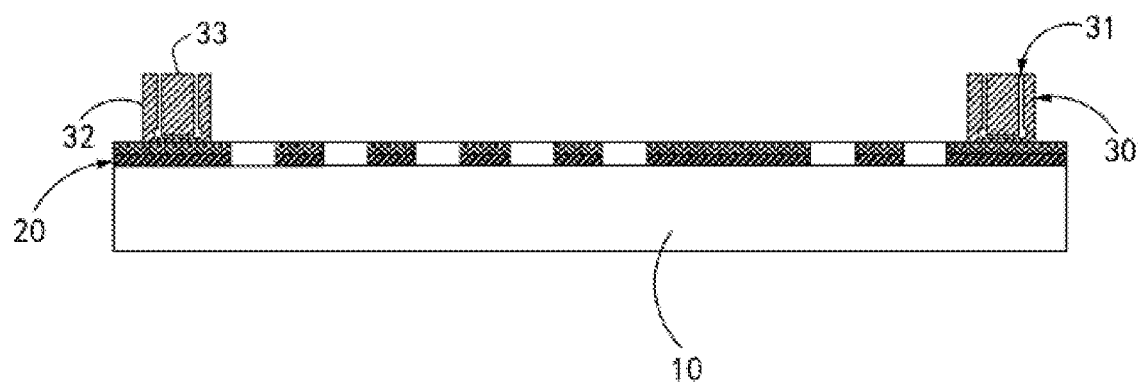
FIG. 9 is a partial schematic view of a photomask protection system according to an eighth exemplary embodiment.

In some embodiments, as shown in FIG. 9, the frame 30 includes a first section 32 and a second section 33. The first section 32 is directly mounted on the substrate 10. The second section 33 is nested in the first section 32. The difference from the embodiment shown in FIG. 8 is that, in the present embodiment, the bottom end of the second section 33 is not snap-fitted in the first section 32, but the interior of the first section 32 still has an inwardly concave groove, as shown in detail in FIG. 9.

Figure 10:
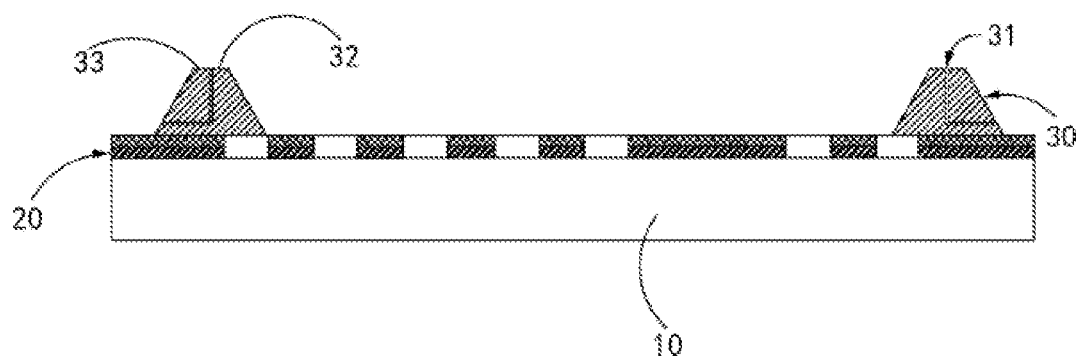
FIG. 10 is a partial schematic view of a photomask protection system according to a ninth exemplary embodiment.

In some embodiments, as shown in FIG. 10, the frame 30 includes a first section 32 and a second section 33. The first section 32 is directly mounted on the substrate 10. The second section 33 is located on the first section 32. A clamping space 31 is formed between the second section 33 and the first section 32. The first section 32 and the second section 33 are integrally formed in a trapezoidal structure in cross section. That is, the first section 32 may be stably supported on the substrate 10. In this case, the longitudinal cross section of the clamping space 31 may be L-shaped.

It should be noted that the specific shape of the clamping space 31 formed between the first section 32 and the second section 33 is not limited, and may be designed accordingly according to the actual requirements, so long as it is possible to ensure that the edges of the pellicle 40 can be clamped. In some embodiments, the longitudinal cross section of the clamping space 31 may be a linear shape, an arc shape, a U shape, an L shape, etc.

Figure 11:
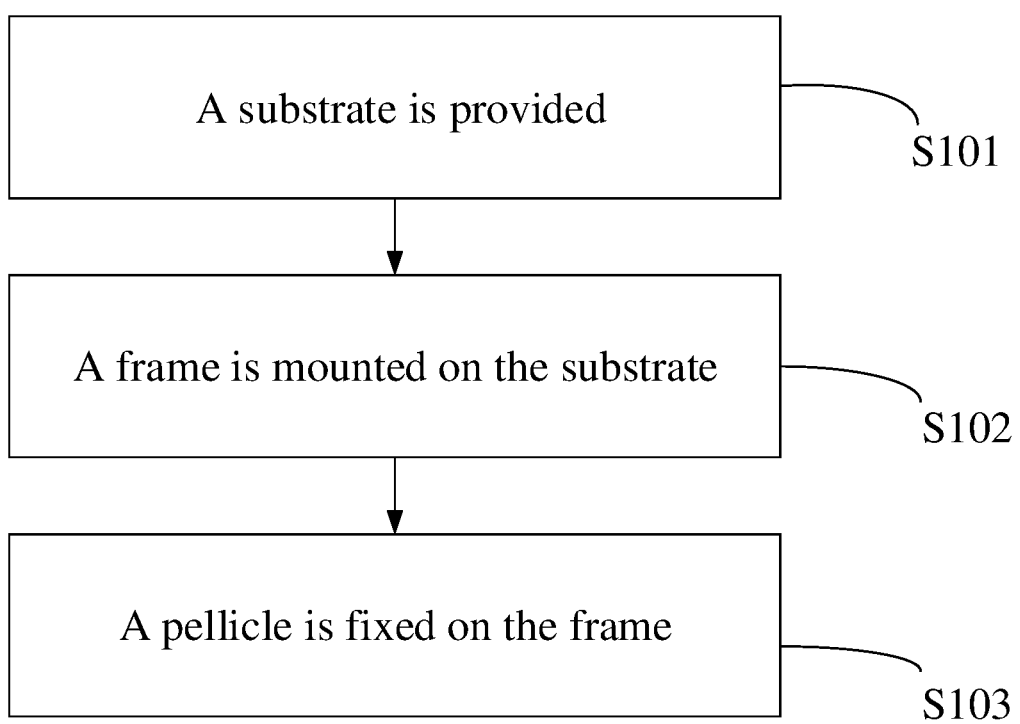
FIG. 11 is a schematic flowchart of a use method of a photomask protection system according to one exemplary embodiment.

One embodiment of the disclosure also provides a use method of a photomask protection system. Referring to FIG. 11, the method includes the following operations.

At S101, a substrate 10 is provided.

At S103, a frame 30 provided with a clamping space 31 is mounted on the substrate 10.

At S105, a pellicle 40 is fixed on the frame 30 with edges of the pellicle 40 being located in the clamping space 31. The substrate 10 is provided with a pattern layer 20.

According to the photomask protection system of one embodiment of the disclosure, by fixing the edges of the pellicle 40 in the clamping space 31 of the frame 30, a fixing effect of the frame 30 on the pellicle 40 can be improved, and the pellicle 40 is prevented from being separated from the frame 30, thereby ensuring that dust particles will not fall onto the pattern layer 20.

In one embodiment, the photomask protection system is the above photomask protection system.

After considering the specification and implementing the disclosure disclosed here, other implementation solutions of the disclosure would be readily conceivable to a person skilled in the art. The disclosure is intended to cover any variations, uses, or adaptations of the disclosure following the general principles thereof and including such departures from the disclosure as come within known or customary practice in the art. It is intended that the specification and example implementations be considered as exemplary only, with a true scope and spirit of the disclosure being indicated by the foregoing claims.

It should be understood that the disclosure is not limited to the exact construction that has been described above and illustrated in the accompanying drawings, and that various modifications and changes may be made without departing from the scope thereof. It is intended that the scope of the disclosure only be limited by the appended claims.

The invention claimed is:

1. A photomask protection device, comprising:
 a frame, the frame being disposed on a substrate of a photomask and provided with a clamping space; and
 a pellicle, edges of the pellicle being fixed in the clamping space; and,
 wherein the clamping space is an accommodation groove having a groove bottom located in the frame, and the frame is formed in one piece.

2. The photomask protection device of claim 1, further comprising:
 a first adhesive layer, the first adhesive layer being filled in the clamping space.

3. The photomask protection device of claim 2, wherein the clamping space comprises:
 a first side wall; and
 a second side wall, the edges of the pellicle being located between the first side wall and the second side wall,
 wherein a gap is formed between at least one of the first side wall or the second side wall and the pellicle, and the first adhesive layer is filled in the gap.

4. The photomask protection device of claim 1, wherein the accommodation groove extends in a first direction which is perpendicular to the substrate;
 or, the accommodation groove extends in a second direction which is parallel to the substrate.

5. The photomask protection device of claim 1, wherein the accommodation groove is arranged in a circumferential direction of the frame to locate the edges of the pellicle in the clamping space.

6. The photomask protection device of claim 1, wherein the accommodation groove comprises a plurality of sub-accommodation grooves spaced apart in a circumferential direction of the frame, and the edges of the pellicle are partially located in the sub-accommodation grooves.

7. The photomask protection device of claim 1, wherein the frame is a rectangular frame or an annular frame.

8. A photomask protection system, comprising
 a photomask protection device and a photomask, wherein photomask protection device comprises:
 a frame, the frame being disposed on a substrate of a photomask and provided with a clamping space; and
 a pellicle, edges of the pellicle being fixed in the clamping space,
 wherein the photomask comprises:
 a substrate, a frame of the photomask protection device being located on the substrate; and
 a pattern layer, the pattern layer being located on the substrate; and,
 wherein the clamping space is an accommodation groove having a groove bottom located in the frame, and the frame is formed in one piece.

9. The photomask protection system of claim 8, further comprising:
 a second adhesive layer located on the substrate, the frame being connected to the substrate through the second adhesive layer.

10. A use method of a photomask protection system of claim 8, comprising:
 providing the substrate;
 mounting, the frame provided with the clamping space, on the substrate; and
 fixing the pellicle on the frame with edges of the pellicle being located in the clamping space,
 wherein the substrate is provided with the pattern layer.

* * * * *